United States Patent
Kim (10) Patent No.: US 8,883,587 B2
(45) Date of Patent: Nov. 11, 2014

(54) METHOD OF MANUFACTURING SEMICONDUCTOR DEVICE

(75) Inventor: Seung Hwan Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 638 days.

(21) Appl. No.: 13/187,175

(22) Filed: Jul. 20, 2011

(65) Prior Publication Data

US 2012/0135586 A1 May 31, 2012

(30) Foreign Application Priority Data

Nov. 26, 2010 (KR) .................. 10-2010-0119202

(51) Int. Cl.
*H01L 21/223* (2006.01)
*H01L 27/108* (2006.01)
*H01L 21/225* (2006.01)

(52) U.S. Cl.
CPC .... *H01L 27/10876* (2013.01); *H01L 27/10885* (2013.01); *H01L 27/10888* (2013.01); *H01L 21/2257* (2013.01)
USPC ............ 438/206; 438/156; 438/173; 438/192

(58) Field of Classification Search
CPC . H01L 21/2257; H01L 21/225; H01L 21/223; H01L 27/10888; H01L 27/10885
USPC ............... 257/302, 329, E27.057, E27.096, 257/E29.183, E29.189, E29.198; 438/156, 438/173, 192, 206
See application file for complete search history.

(56) References Cited

U.S. PATENT DOCUMENTS

| 6,936,512 | B2 | 8/2005 | Chudzik et al. | |
| 2002/0066925 | A1 | 6/2002 | Gruening et al. | |
| 2010/0090348 | A1* | 4/2010 | Park et al. | 257/773 |
| 2010/0267237 | A1* | 10/2010 | Bonser et al. | 438/689 |
| 2011/0104870 | A1* | 5/2011 | Kobayashi et al. | 438/458 |
| 2011/0180910 | A1* | 7/2011 | Kim | 257/623 |

* cited by examiner

Primary Examiner — Daniel Whalen
Assistant Examiner — Suberr Chi (57) ABSTRACT

A method of manufacturing a semiconductor device includes forming silicon line patterns in a semiconductor substrate, forming an insulating layer over the silicon line patterns, forming a conductive pattern between the silicon line patterns, forming a spacer over the substrate, forming an interlayer insulating layer between the silicon line patterns, removing the spacer on one side of the silicon line patterns to expose the conductive pattern, forming a bit line contact open region by removing the interlayer insulating layer, forming a polysilicon pattern to cover the bit line contact open region, and forming a junction region diffused to the silicon line pattern through the bit line contact open region. Thereby, a stacked structure of a titanium layer and a polysilicon layer are stably formed when forming a buried bit line and a bit line contact is formed using diffusion of the polysilicon layer to prevent leakage current.

18 Claims, 6 Drawing Sheets

METHOD OF MANUFACTURING SEMICONDUCTOR DEVICE

CROSS-REFERENCES TO RELATED APPLICATION

The present application claims priority to Korean patent application number 10-2010-0119202 filed on 26 Nov. 2010, which is incorporated by reference in its entirety.

BACKGROUND OF THE INVENTION

1. Technical Field

The present invention relates to a method of manufacturing a semiconductor capable of preventing loss of a semiconductor substrate and a bit line.

2. Related Art

With the high integration degree of semiconductor devices, demand for dynamic random access memories (DRAMs) of below 40 nm grade has increased to further improve integration degree. However, it is very difficult to scale down below 40 nm in a planar or recess gate transistor used in 8 $F^2$ (F: minimum feature size) or 6 $F^2$ cell architecture. Accordingly, DRAMs having 4 $F^2$ cell architecture have been demanded to improve the integration degree 1.5 to 2 times at the same scaling. Thus a vertical channel transistor has been suggested.

A vertical channel transistor is a transistor in which a channel is vertically formed by forming a surround type gate electrode around a pillar so that it extends vertically on a semiconductor substrate and forming a source region and a drain region in upper and lower portions of the active pillar with the gate electrode as the center, respectively. Thus, a larger the channel region may be maintained as the size of the transistor is reduced.

A channel (or channel region) of a vertical channel MOS transistor is formed to be vertical with respect to the surface of a semiconductor substrate by forming a gate electrode around an active pillar, which also extends vertically with respect to the surface of the semiconductor substrate, and forming a source and a drain in upper and lower portions with the gate electrode as the center. Thus, the channel length or region of the MOS transistor may be kept relatively large as the size of the MOS transistor is reduced. In implementing such a vertical channel semiconductor device, a technology in which the bit line is buried within a device isolation layer of a cell has been suggested.

According to the related art, a buried bit line in a vertical channel semiconductor device is formed by etching a semiconductor substrate with an etching condition that the buried bit line is self-aligned with the vertical pillar and an insulating layer formed around the vertical pillar. The buried bit line formed by such a method is in contact with the bit line contact, which is diffused and formed at a sidewall of the vertical pillar.

In an embodiment, the bit line contact is diffused into the semiconductor substrate to form a junction. However, when a titanium nitride layer or a tungsten layer is used to form the junction, leakage current increases as $TiSi_2$ is generated. When a polysilicon layer is used in order to prevent this problem, resistance increases. Thereby, a method of performing a diffusion process after a metal layer is formed at a lower portion and a polysilicon layer is formed on the metal, is introduced.

Since a contact is open when an etch back process for the bit line is performed after the contact is formed by diffusing a metal layer at the lower portion, a portion of the semiconductor substrate may be lost. In addition, when the contact is formed after the bit line is formed, the bit line is also removed when stripping a metal spacer to open an area where the contact is to be formed.

SUMMARY

The present invention is directed to providing a method of manufacturing a semiconductor device capable of preventing loss of a semiconductor substrate by opening a bit line contact when an etch back process for forming a bit line is performed after the bit line contact is formed, and preventing loss of the bit line when a metal spacer strip process is performed to open a region where the bit line contact is to be formed when the bit line contact is formed after the bit line is formed.

According to one aspect of an exemplary embodiment, a method of manufacturing a semiconductor device includes etching a semiconductor substrate to form first and second silicon line patterns, each of the first and second silicon line patterns having first and second sidewalls; forming an insulating layer over the first and second sidewalls of each of the first and second silicon line patterns; forming a conductive pattern at a lower portion between the first sidewall of the second silicon line pattern and the second sidewall of the first silicon line pattern; forming a spacer over the first and second sidewalls of each of the first and second silicon line patterns and the conductive pattern; forming an interlayer insulating layer filled between the silicon line patterns; removing at least a portion of the spacer provided over the first sidewall of the second silicon line pattern to expose a portion of the conductive pattern proximate the first sidewall of the second silicon pattern; removing the interlayer insulating layer to expose a portion of the first sidewall of the second silicon line pattern to form a bit line contact open region; forming a polysilicon pattern over the conductive pattern and cover the bit line contact open region, the polysilicon pattern including dopants; and diffusing the dopants from the polysilicon pattern into the second silicon line pattern through the bit line contact open region to form a junction region.

The forming the first and second silicon line patterns includes forming a mask pattern over the semiconductor substrate; and etching a portion of the semiconductor substrate using the mask pattern as an etch mask.

The forming the insulating layer includes forming a first sidewall insulating layer over the semiconductor substrate including the first and second silicon line patterns and forming a second sidewall insulating layer over the first sidewall insulating layer.

The first sidewall insulating layer may include an oxide layer.

The method may further include a cleaning process for reducing the thickness of the first sidewall insulating layer.

The second sidewall insulating layer may include low pressure tetra ethyl ortho silicate (LP-TEOS).

The conductive pattern formed in the lower portion between the silicon line patterns may include a titanium nitride layer or a tungsten layer.

The method may further include forming a spacer liner nitride layer over a sidewall the insulating layer and the conductive pattern after the forming the conductive pattern and thereafter, etching a portion of the conductive pattern.

The forming the spacer may include forming an amorphous carbon layer over the conductive pattern and the silicon line patterns and performing an etch back process for the amorphous carbon layer.

The forming the amorphous carbon layer may include forming an amorphous carbon layer to a thickness of 50 Å to 70 Å.

The forming the amorphous carbon layer may include forming an amorphous carbon layer using $C_2H_2$ gas at a power of 250 to 400 W through a plasma enhanced chemical vapor deposition (PECVD) process.

The interlayer insulating layer may include spin on dielectric (SOD).

The removing the spacer formed at one side of each of the silicon line patterns to expose the conductive pattern includes: etching the interlayer insulating layer and the spacer to form a recess; forming a liner polysilicon layer over the etched interlayer insulating layer, the etched spacer, and the silicon line pattern; forming a liner polysilicon pattern by etching a portion of the liner polysilicon layer to expose the spacer formed at one side of each of the silicon line patterns; and removing the spacer using the liner polysilicon pattern as a mask.

The etching the interlayer insulating layer and the spacer may include etching the interlayer insulating layer and the spacer to form a recess having a depth of 500 Å to 600 Å.

The forming the liner polysilicon pattern may include performing ion implantation to the liner polysilicon layer at an angle, and removing a portion of the liner polysilicon layer that is not ion-implanted through the ion implantation.

The removing the spacer may include removing the spacer by plasma using an oxygen or helium gas.

The method may further include, after the forming the bit line contact open region, removing a portion of the spacer remaining at an opposite side of the silicon line pattern to bit line contact open region, forming a first doped polysilicon layer over the conductive pattern and the insulating layer, and performing a plasma doping (PLAD) process on a surface of the first doped polysilicon layer.

Dopants for the plasma doping are arsenic (As).

The forming the polysilicon pattern may include forming a second doped polysilicon layer over the first doped polysilicon layer and performing an etch back process for the second and first doped polysilicon layers to form a polysilicon pattern.

The forming the junction may include performing a rapid thermal annealing process.

These and other features, aspects, and embodiments are described below in the section entitled "DESCRIPTION OF EXEMPLARY EMBODIMENT."

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Exemplary embodiments are described herein with reference to cross-sectional illustrations that are schematic illustrations of exemplary embodiments (and intermediate structures). As such, variations in the shapes of the illustrations as a result, for example, of manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

Hereinafter, a method of manufacturing a semiconductor device according to an exemplary embodiment of the present invention will be described in detail with reference to accompanying drawings.

FIGS. 1A to 1L are cross-sectional views illustrating a semiconductor device according to an exemplary embodiment of the present invention.

Figure 1A:
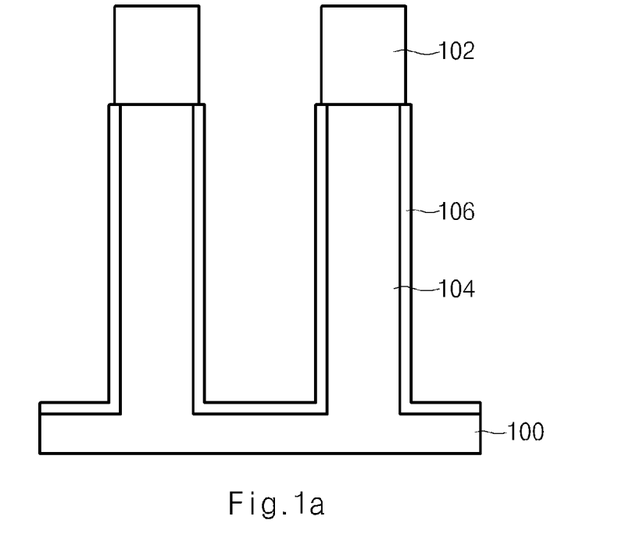
FIGS. 1A to 1L are cross-sectional views illustrating a method of manufacturing a semiconductor device according to an exemplary embodiment of the present invention.

Referring to FIG. 1A, a mask pattern 102 is formed over a semiconductor substrate 100. The semiconductor substrate 100 is etched using the mask pattern 102 as an etch mask to form silicon line patterns 104. In an embodiment, the mask pattern 102 is a hard mask and may include a nitride layer. Subsequently, a first sidewall insulating layer 106 is formed by oxidizing an exposed surface of the semiconductor substrate 100. In an embodiment, the first sidewall insulating layer 106 may include an oxide layer having a thickness of 50 Å to 60 Å.

Figure 1B:
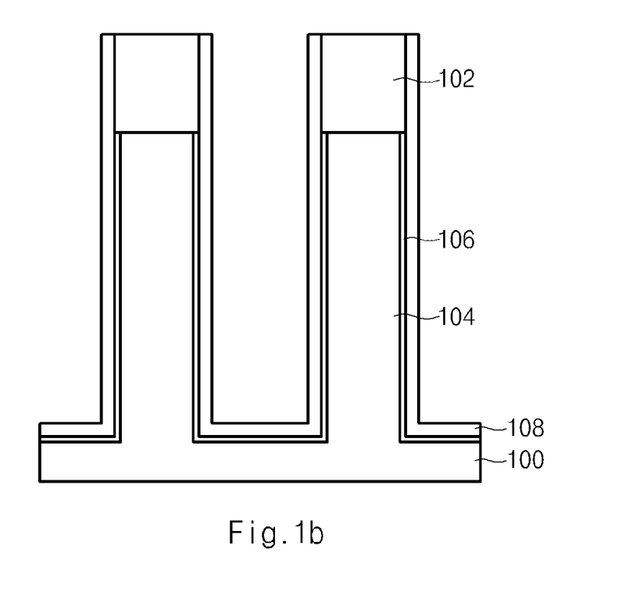

Referring to FIG. 1B, a cleaning process is performed to reduce the thickness the first sidewall insulating layer 106 to a predetermined thickness. Then a second sidewall insulating layer 108 is formed over the first sidewall insulating layer 106. Here, the second sidewall insulating layer 108 may include low-pressure tetra ethyl ortho silicate (LP-TEOS) and may be formed to a thickness of 70 Å to 80 Å.

Figure 1C:
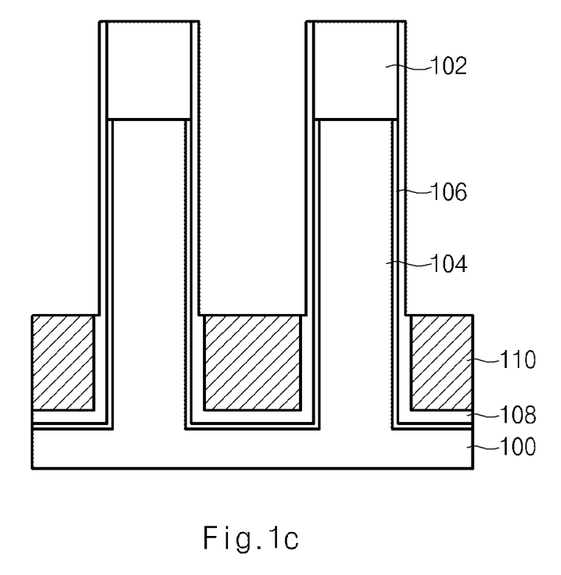

Referring to FIG. 1C, a bit line conductive layer is formed over the second sidewall insulating layer 108 to fill the space between the silicon line patterns 104, and an etch back process is performed to form a conductive pattern 110, which is disposed only at a lower portion between the silicon line patterns 104. In an embodiment, the conductive pattern 110 may include a titanium nitride layer or a tungsten layer. At this time, the conductive pattern 110 may define a lower portion of a bit line, which is to be formed in a subsequent process. After the conductive pattern 110 is formed, a cleaning process is performed to reduce the thickness of the second sidewall insulating layer 108.

Figure 1D:
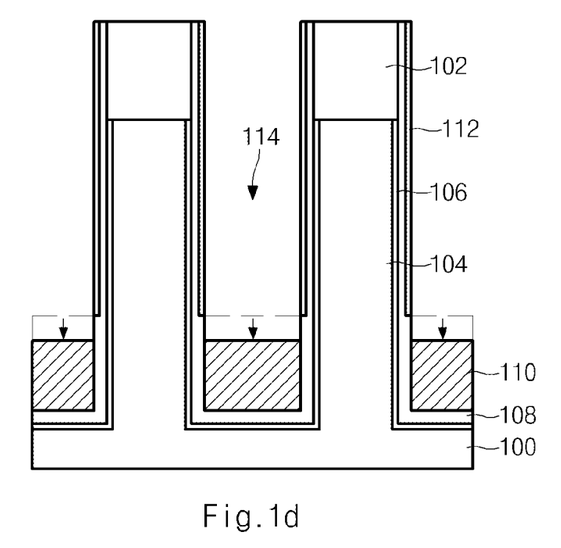

Referring to FIG. 1D, a liner nitride layer is formed over the second sidewall insulating layer 108 and the conductive pattern 110 and an etch back process is performed to form a spacer liner nitride layer 112. Subsequently, the conductive pattern 110 is etched to a predetermined thickness to form a recess 114. The recess 114 may define a region in which a bit line contact is to be formed in a subsequent process.

Figure 1E:
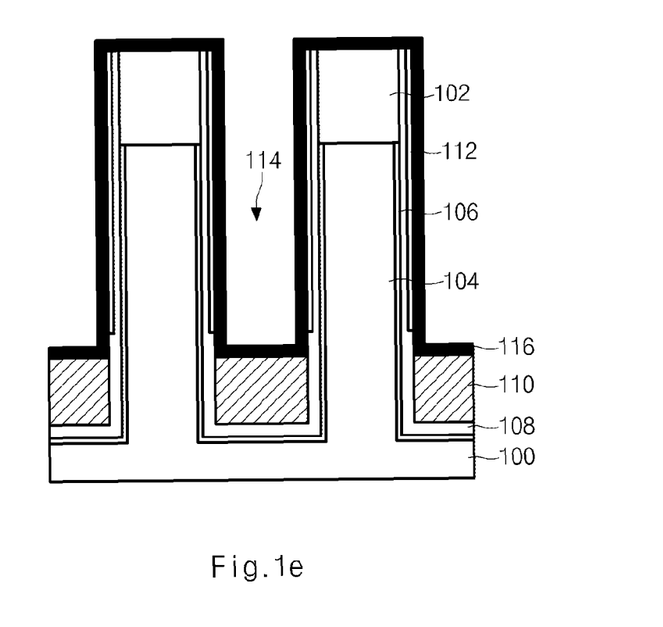

Referring to FIG. 1E, an amorphous carbon layer 116 is formed over the entire resultant structure. The amorphous carbon layer 116 may be formed to a thickness of 50 Å to 70 Å. The amorphous carbon layer 116 may be formed using $C_2H_2$ gas through a plasma enhanced chemical vapor deposition (PECVD) process at a power of 250 to 400 W. In an embodiment, the amorphous carbon layer 116 is formed for its etch selectivity; e.g., it has the characteristic of being easily removed by plasma etch. As a result of this, loss of the conductive pattern 110 can be prevented when a bit line contact open region is formed in a later process exposing the conductive pattern 110. That is, since the region in which a bit line contact is to be formed is exposed by removing the amorphous carbon layer 116, a process of stripping metal when this region is open is not performed, unlike in the related art, thereby preventing loss of both a bit line and the metal.

Figure 1F:
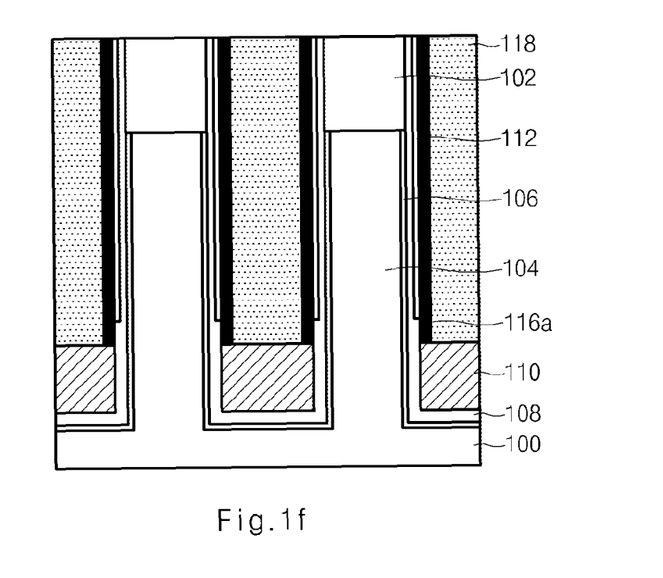

Referring to FIG. 1F, an etch back process for the amorphous carbon layer 116 is performed to remove a portion of the amorphous carbon layer 116, which is formed over the conductive pattern 110 and the mask pattern 102, thereby forming an amorphous carbon layer spacer 116a. An interlayer insulating layer 118 is formed between the silicon line patterns 104. In an embodiment, the interlayer insulating layer 118 may include a spin on dielectric (SOD) material having a good gap-fill characteristic.

Figure 1G:
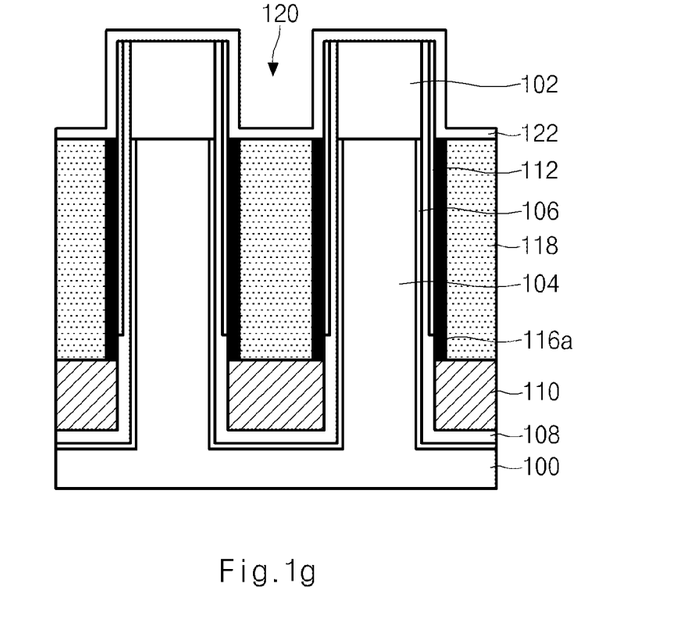

Referring to FIG. 1G, a recess 120 is formed by etching the interlayer insulating layer 118 and the amorphous carbon layer spacer 116a to a predetermined depth. The recess 120 may have a depth of 500 Å to 600 Å. Subsequently, a liner polysilicon layer 122 is formed over the recess 120 and the mask pattern 102. At this time, the liner polysilicon layer 122 may be formed to a thickness of 70 Å to 80 Å.

Figure 1H:
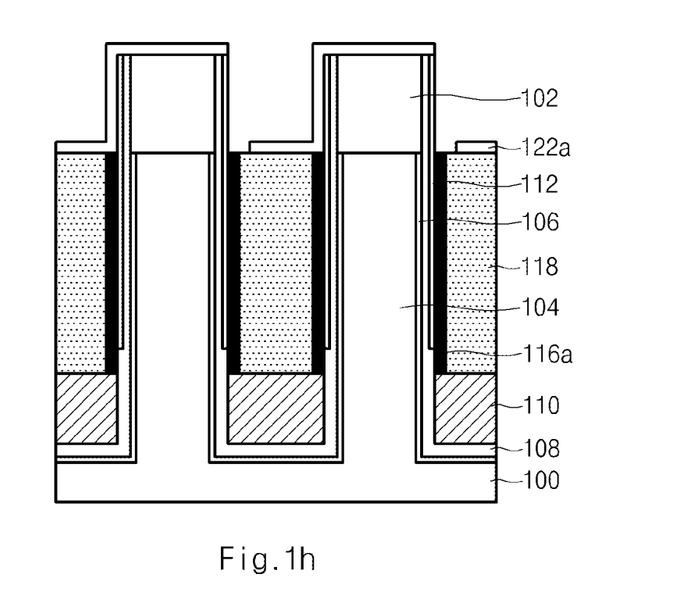

Referring to FIG. 1H, a portion of the liner polysilicon layer 122 formed at a sidewall of one side of the mask pattern 102 is partially removed to expose the amorphous carbon layer spacer 116a, thereby forming a liner polysilicon pattern 122a. The liner polysilicon pattern 122a may be formed by an ion implantation process or a mask process. When the liner polysilicon pattern 122a is formed through an ion implantation process, the ion implantation process may be performed at a constant tilted angle from a surface of the mask pattern 102 so that a portion of the polysilicon layer 122, which is not subjected to the ion implantation, is removed and the liner polysilicon pattern 122a of the polysilicon layer 122, which is subjected to the ion implantation, remains. However, the present invention is not limited thereto and the liner polysilicon pattern 122a may be formed by a patterning process using an exposure and development process.

Figure 1I:
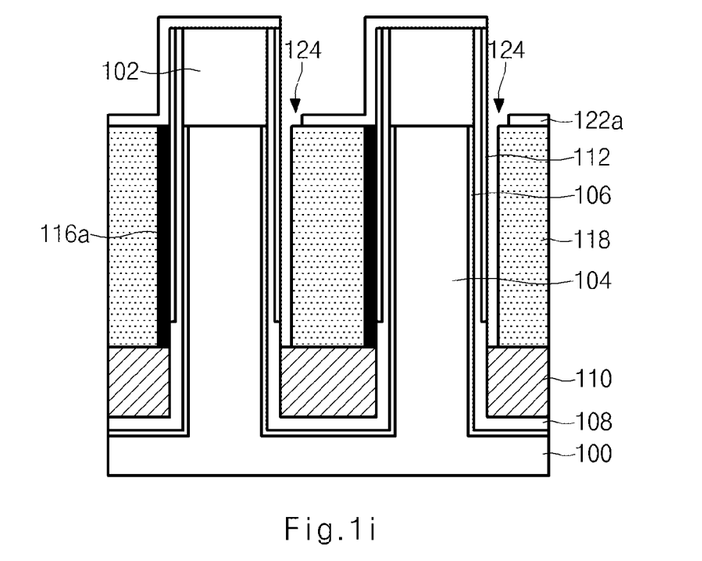

Referring to FIG. 1I, the amorphous carbon layer spacer 116a is removed to expose the conductive pattern 110 using the liner polysilicon pattern 122a as an etching mask, thereby forming a recess 124. In an embodiment, the amorphous carbon layer spacer 116a may be removed using plasma. More specifically, the amorphous carbon layer spacer 116a may be removed using an oxygen gas or a helium gas. Since the amorphous carbon layer spacer 116a is readily removed by plasma, the amorphous carbon layer spacer 116a can be removed without loss of the conductive pattern 110.

Figure 1J:
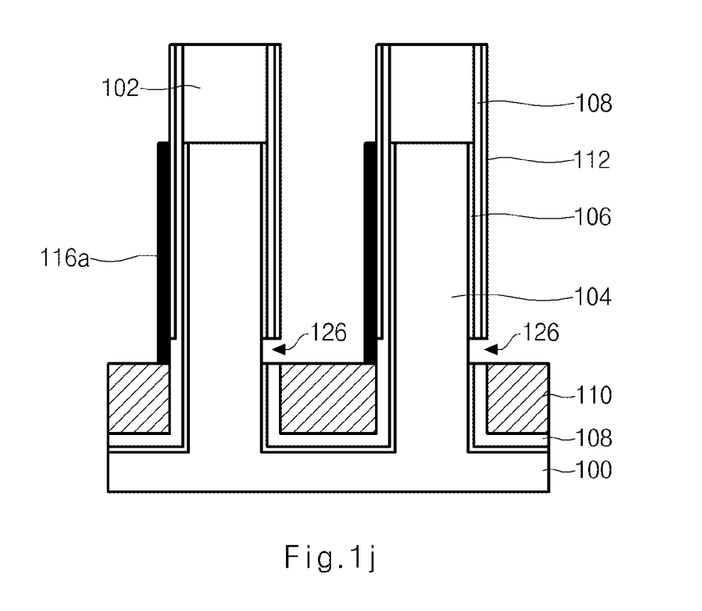

Referring to FIG. 1J, the liner polysilicon pattern 122a is removed and the interlayer insulating layer 118 is removed. When the interlayer insulating layer 118 is removed, the second sidewall insulating layer 108 and the first sidewall insulating layer 106 exposed by the spacer liner nitride layer 112 are also removed, thereby exposing a sidewall of the silicon line patterns 104 from which the amorphous carbon layer spacer 116a is removed and forming a bit line contact open region 126.

Figure 1K:
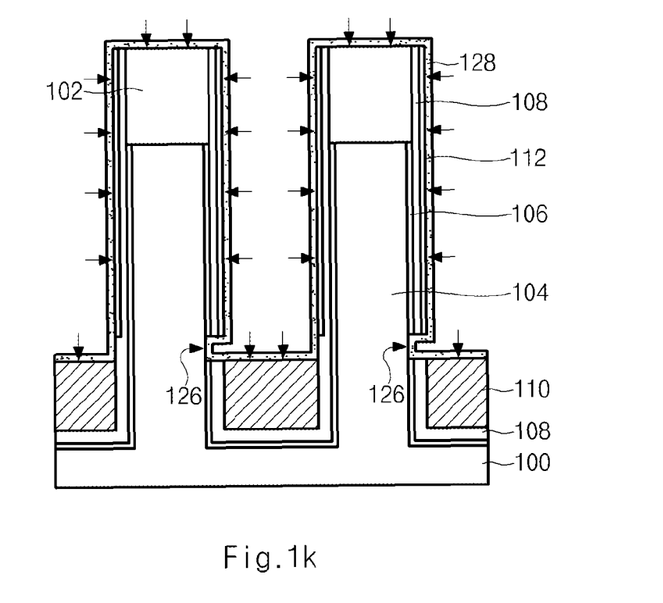

Referring to FIG. 1K, the amorphous carbon layer spacer 116a, disposed at an opposite sidewall of the bit line contact open region 126, is removed, and a first doped polysilicon layer 128 is formed over the entire resultant structure according to an embodiment of the present invention. The first doped polysilicon layer 128 may be formed to a thickness of 50 Å to 70 Å and may be formed using phosphorous (Ph) as a dopant. Subsequently, a surface of the first doped polysilicon layer 128 is doped using plasma doping. Dopants used in the plasma doping may include As. The plasma doping into the surface of the semiconductor substrate is performed to form an ohmic contact between a bit line and a polysilicon pattern (130 in FIG. 1L), which will be formed in a subsequent process. This reduces the depth of a junction region (132 in FIG. 1L) formed in the semiconductor substrate 100 through the bit line contact open region 126 in the following process and reduces parasitic capacitance of the bit line.

Figure 1L:
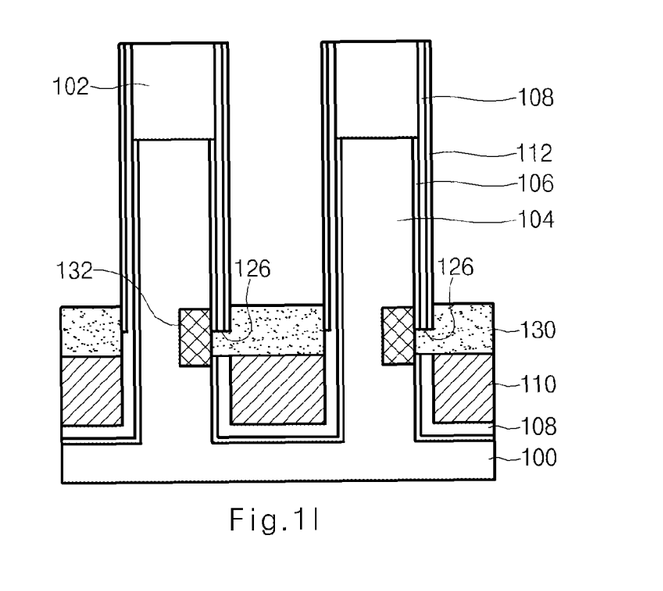

Referring to FIG. 1L, a second doped polysilicon layer is formed over the first doped polysilicon layer 128 and an etch back process for the first doped polysilicon layer 128 and second doped polysilicon layer is performed to form a polysilicon pattern 130 covering the bit line contact open region 126. Subsequently, a rapid thermal annealing process is performed so that the dopants of the polysilicon pattern 130 are diffused into the semiconductor substrate 100, which is in contact with the bit line contact open region 126, to form a junction region 132. In an embodiment, the junction region 132 defines a bit line contact.

The polysilicon pattern 130 may define a bit line together with the conductive pattern 110. The conductive pattern 110 may form an ohmic contact with the polysilicon pattern 130 by the plasma doping, which is performed on the surface of the first doped polysilicon layer 128 so that it can stably function as the bit line.

As described above, according to an exemplary embodiment of the present invention, the bit line contact is formed in a junction type after the bit line is formed so that it can prevent loss of the semiconductor substrate when performing an etch back process for the bit line. In addition, the amorphous carbon layer spacer is formed instead of a metal spacer when forming the bit line contact open region so that, since a process of stripping the metal spacer is omitted, loss of the bit line can be prevented and the bit line contact open region can be formed without loss of the bit line.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, comprising:
   etching a semiconductor substrate to form first and second silicon line patterns, each of the first and second silicon line patterns having first and second sidewalls;
   forming an insulating layer over the first and second sidewalls of each of the first and second silicon line patterns;
   forming a conductive pattern at a lower portion between the first sidewall of the second silicon line pattern and the second sidewall of the first silicon line pattern;
   forming a spacer over the first and second sidewalls of each of the first and second silicon line patterns and the conductive pattern;
   forming an interlayer insulating layer filled between the silicon line patterns;
   removing at least a portion of the spacer provided over the first sidewall of the second silicon line pattern to expose a portion of the conductive pattern proximate to the first sidewall of the second silicon pattern;
   removing the interlayer insulating layer to expose a portion of the first sidewall of the second silicon line pattern to form a bit line contact open region;
   removing a portion of the spacer remaining at an opposite side of the silicon line pattern to the bit line contact open region;
   forming a first doped polysilicon layer over the conductive pattern and the interlayer insulating layer;
   performing a plasma doping (PLAD) process on a surface of the first doped polysilicon layer;
   forming a second doped polysilicon layer over the first doped polysilicon layer;

performing an etch back process for the second and first doped polysilicon layers to form a polysilicon pattern over the conductive pattern and cover the bit line contact open region, the polysilicon pattern including dopants; and diffusing the dopants from the polysilicon pattern into the second silicon line pattern through the bit line contact open region to form a junction region.

2. The method of claim 1, wherein the forming the first and second silicon line patterns includes:
   forming a mask pattern over the semiconductor substrate; and
   etching a portion of the semiconductor substrate using the mask pattern as an etch mask.

3. The method of claim 1, wherein the forming the insulating layer includes:
   forming a first sidewall insulating layer over the semiconductor substrate including the first and second silicon line patterns; and
   forming a second sidewall insulating layer over the first sidewall insulating layer.

4. The method of claim 3, wherein the first sidewall insulating layer includes an oxide layer.

5. The method of claim 3, further comprising performing a cleaning process for reducing a thickness of the first sidewall insulating layer after the forming the first sidewall insulating layer.

6. The method of claim 5, wherein the second sidewall insulating layer includes low pressure tetra ethyl ortho silicate (LP-TEOS).

7. The method of claim 1, wherein the conductive pattern formed at the lower portion between the silicon line patterns includes a titanium nitride layer or a tungsten layer.

8. The method of claim 1, further comprising:
   forming a spacer liner nitride layer over a sidewall of the insulating layer and the conductive pattern after the forming the conductive pattern; and
   thereafter, etching a portion of the conductive pattern.

9. The method of claim 1, wherein the forming the spacer includes:
   forming an amorphous carbon layer over the conductive pattern and the silicon line patterns; and
   performing an etch back process on the amorphous carbon layer.

10. The method of claim 9, wherein the forming the amorphous carbon layer includes forming the amorphous carbon layer to a thickness of 50 Å to 70 Å.

11. The method of claim 9, wherein the forming the amorphous carbon layer includes using $C_2H_2$ gas at a power of 250 to 400 W in a plasma enhanced chemical vapor deposition (PECVD) process.

12. The method of claim 1, wherein the interlayer insulating layer includes spin on dielectric (SOD).

13. The method of claim 1, wherein the removing the spacer formed at one side of each of the silicon line patterns to expose the conductive pattern includes:
   etching the interlayer insulating layer and the spacer to form a recess;
   forming a liner polysilicon layer over the etched interlayer insulating layer, the etched spacer, and the silicon line pattern;
   forming a liner polysilicon pattern by etching a portion of the liner polysilicon layer to expose the spacer formed at one side of each of the silicon line patterns; and
   removing the spacer using the liner polysilicon pattern as a mask.

14. The method of claim 13, wherein the etching the interlayer insulating layer and the spacer includes etching the interlayer insulating layer and the spacer to form the recess having a depth of 500 Å to 600 Å.

15. The method of claim 13, wherein the forming the liner polysilicon pattern includes:
   performing ion implantation on the liner polysilicon layer at an angle; and
   removing a portion of the liner polysilicon layer that is not ion-implanted through the ion implantation.

16. The method of claim 1, wherein the removing the portion of the spacer includes removing the spacer by plasma using an oxygen or helium gas.

17. The method of claim 1, wherein dopants for the plasma doping are arsenic (As).

18. The method of claim 1, wherein the forming the junction includes performing a rapid thermal annealing process.

* * * * *